United States Patent
Yoshida et al.

(10) Patent No.: US 10,392,704 B2
(45) Date of Patent: Aug. 27, 2019

(54) COATING ELECTRONIC COMPONENT

(71) Applicant: TDK CORPORATION, Tokyo (JP)

(72) Inventors: Kenichi Yoshida, Tokyo (JP); Yuhei Horikawa, Tokyo (JP); Atsushi Sato, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/415,493

(22) Filed: Jan. 25, 2017

(65) Prior Publication Data

US 2017/0130337 A1    May 11, 2017

Related U.S. Application Data

(62) Division of application No. 13/162,198, filed on Jun. 16, 2011, now abandoned.

(30) Foreign Application Priority Data

Jul. 20, 2010   (JP) .................. 2010-163128

(51) Int. Cl.
| | | |
|---|---|---|
| *C23C 18/42* | (2006.01) | |
| *C23C 18/16* | (2006.01) | |
| *C23C 18/32* | (2006.01) | |
| *C23C 18/54* | (2006.01) | |
| *C23C 28/02* | (2006.01) | |
| *H01L 23/00* | (2006.01) | |

(52) U.S. Cl.
CPC ...... *C23C 18/1655* (2013.01); *C23C 18/1637* (2013.01); *C23C 18/1651* (2013.01);
(Continued)

(58) Field of Classification Search
CPC ............ C23C 18/1655; C23C 18/1637; C23C 18/1651; C23C 18/42; C23C 18/54; H01L 2224/03464; H01L 2224/0401; H01L 2224/04042; H01L 2224/05083; H01L 2224/05139; H01L 2224/05144; H01L 2224/05147
(Continued)

(56) References Cited

U.S. PATENT DOCUMENTS 6,171,394 B1 *  1/2001  Watanabe ............... C30B 25/02
                                                          117/102
8,426,742 B2    4/2013  Ejiri et al.
(Continued)

FOREIGN PATENT DOCUMENTS

| JP | 2007-123883 A | 5/2007 |
| JP | 2008-291348 A | 12/2008 |

(Continued)

OTHER PUBLICATIONS

Aug. 26, 2011 European Search Report issued in Application No. 11169812.2.
(Continued)

*Primary Examiner* — Brian K Talbot
(74) *Attorney, Agent, or Firm* — Oliff PLC (57) ABSTRACT

A method of providing a coating on a conductor. The coating has a first layer containing palladium and a second layer containing gold from the conductor side. The first layer has an inner layer on the conductor side and an outer layer arranged nearer to the second layer than the inner layer, and the outer layer has a higher phosphorus concentration than the inner layer.

12 Claims, 2 Drawing Sheets

(52) U.S. Cl.
CPC .............. *C23C 18/32* (2013.01); *C23C 18/42* (2013.01); *C23C 18/54* (2013.01); *C23C 28/02* (2013.01); *H01L 24/03* (2013.01); *H01L 24/05* (2013.01); *H01L 2224/03464* (2013.01); *H01L 2224/0401* (2013.01); *H01L 2224/04042* (2013.01); *H01L 2224/05083* (2013.01); *H01L 2224/05139* (2013.01); *H01L 2224/05144* (2013.01); *H01L 2224/05147* (2013.01); *H01L 2224/05164* (2013.01); *H01L 2224/05644* (2013.01); *H01L 2924/01015* (2013.01); *H01L 2924/14* (2013.01)

(58) Field of Classification Search
USPC .................... 427/58, 79–81; 29/25.41, 25.42
See application file for complete search history.

(56) References Cited

U.S. PATENT DOCUMENTS

| | | | |
|---|---|---|---|
| 2003/0127701 A1* | 7/2003 | Tiziani | .............. H01L 23/53238 257/459 |
| 2007/0104929 A1 | 5/2007 | Yim et al. | |
| 2010/0071940 A1* | 3/2010 | Ejiri | ....................... H05K 3/244 174/257 |
| 2010/0258954 A1* | 10/2010 | Andoh | .............. H01L 23/49811 257/784 |
| 2010/0302748 A1* | 12/2010 | Taniguchi | ............... H01L 23/15 361/772 |

FOREIGN PATENT DOCUMENTS

| | | |
|---|---|---|
| JP | 4351736 B2 | 10/2009 |
| JP | 2010-037603 A | 2/2010 |
| WO | 2008/136327 A1 | 11/2008 |
| WO | 2009/072544 A1 | 6/2009 |

OTHER PUBLICATIONS

Dec. 2, 2014 Office Action issued in Japanese Patent Application No. 2014-080033.

* cited by examiner

COATING ELECTRONIC COMPONENT

This is a divisional application of application Ser. No. 13/162,198 filed Jun. 16, 2011, which claims priority to JP 2010-163128 filed Jul. 20, 2010. The disclosures of the prior applications are hereby incorporated by reference herein in its (their) entirety.

BACKGROUND OF THE INVENTION

Field of the Invention

The present invention relates to a coating provided on a conductor, and an electronic component having a conductor coated with the coating.

Related Background Art

An electronic component has a signal transmission part for exchange of signals with an external device. For this signal transmission part to perform the exchange of electric signals with the external device, the signal transmission part needs to have high electrical conductivity and therefore copper or a copper-based alloy is generally used as a base material of the signal transmission part. However, copper or the copper-based alloy has the property of being easily corroded by oxygen in air or by corrosive gas, and therefore there has been investigation to form such a coating layer that a nickel plated film and a gold plated film were laid on a surface of the base material, for the purpose of controlling and preventing corrosion.

For example, Japanese Patent Application Laid-open. No. 2010

For example, Japanese Patent Application Laid-open No. 2010-37603 (Patent Literature 1) proposes that an electroless nickel film is formed as an underlying layer on a base material of a connection terminal part and then a displacement electroless gold plated film and a reduction electroless gold plated film are successively formed thereon.

SUMMARY OF THE INVENTION

The coating layer described in Patent Literature 1 was produced in such a manner that in a displacement electroless gold plating process, electrons to reduce gold ions in a plating solution are generated by corrosion reaction of the nickel plated film. For this reason, the nickel plated film is likely to be corroded and thus easy to produce defects. In order to prevent occurrence of such defects of the gold plated film, it is possible to solve the problem by increasing the thickness of the gold plated film to a sufficiently large level, but in this case, the cost of the coating layer tends to increase because gold is expensive in general.

On the other hand, in the case where the thickness of the gold plated film is decreased or where no gold plated film is formed, the nickel plated film is exposed as an outermost layer and the corrosion resistance degrades.

The present invention has been accomplished in view of the above circumstances and it is an object of the present invention to provide a coating at low manufacturing cost and with adequately excellent corrosion resistance. It is another object of the present invention to provide an electronic component having a signal transmission part with the coating, at low manufacturing cost and with adequately excellent corrosion resistance.

For achieving the above object, the present invention provides a coating provided on a conductor, the coating comprising: a first layer containing palladium and a second layer containing gold from the conductor side, wherein the first layer has a first region on the conductor side, and a second region arranged nearer to the second layer than the first region, and wherein the second region has a higher phosphorus concentration than the first region.

The coating of the present invention comprises the first layer having the palladium-containing first region with the lower phosphorus concentration on the conductor side and having the second region with the higher phosphorus concentration than the first region, on the second layer side. Since the second region in this first layer has the higher phosphorus concentration than the first region, it is excellent in corrosion resistance. On the other hand, since the first region in the first layer has the lower phosphorus concentration than the second region, it is superior in adhesion to the conductor and it can be readily formed on the conductor. Therefore, corrosion of the conductor can be adequately suppressed without need for increasing the thickness of the second layer containing gold.

The first layer in the coating of the present invention preferably has an inside layer including the first region and an outside layer including the second region, from the conductor side. When the first layer has the layered structure as in this configuration, it is feasible to more adequately suppress the corrosion of the conductor.

At least one of the first region and the second region in the coating of the present invention preferably has a region whose phosphorus concentration decreases with decreasing distance to the conductor. This allows the coating to be provided with adequately excellent corrosion resistance, while ensuring a good deposition characteristic of palladium on the conductor.

Preferably, the phosphorus concentration in the first region in the coating of the present invention is not more than 0.01% by mass and the phosphorus concentration in the second region is more than 0.01% by mass and not more than 7% by mass. This allows the coating to be provided with easiness to manufacture and corrosion resistance together at higher levels.

The first layer in the coating of the present invention preferably has the thickness in the range of 0.1 to 0.4 μm. This allows the coating to be provided with adequately excellent corrosion resistance, while reducing the manufacturing cost of the coating sufficiently.

The coating of the present invention preferably comprises an underlying layer containing nickel between the conductor and the first layer. This allows the thickness of the first layer to be decreased while maintaining the excellent corrosion resistance, thereby further reducing the manufacturing cost.

The present invention also provides an electronic component comprising a signal transmission part having the aforementioned coating, and the conductor coated with the coating. Since this signal transmission part is configured so that the conductor is coated with the coating having the above feature, it can be manufactured at low manufacturing cost and with adequately excellent corrosion resistance.

The present invention successfully provides the coating at low manufacturing cost and with adequately excellent corrosion resistance. It also provides the electronic component with the signal transmission part comprising the coating at low manufacturing cost and with adequately excellent corrosion resistance.

DESCRIPTION OF THE PREFERRED EMBODIMENTS

The preferred embodiments of the present invention will be described below with reference to the drawings as needed. In each drawing, identical or equivalent elements will be denoted by the same reference signs, without redundant description.

Figure 1:
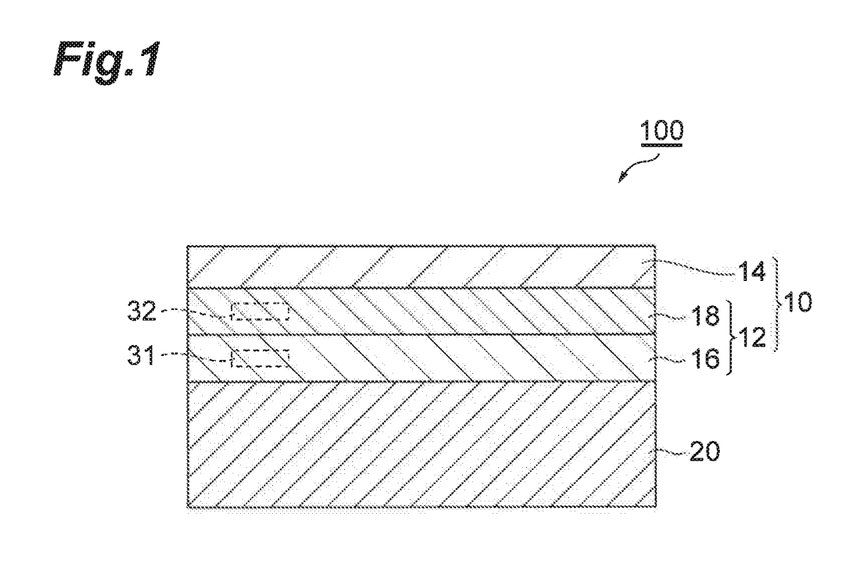
FIG. 1 is a schematic cross-sectional view showing a preferred embodiment of the signal transmission part with the coating according to the present invention.

FIG. 1 is a cross-sectional view schematically showing the signal transmission part with the coating according to an embodiment the present invention. The signal transmission part 100 in FIG. 1 constitutes a signal transmission part of an electronic component and has a conductor 20 and a coating 10 coating the conductor 20. The coating 10 of the present embodiment is a coating layer provided for preventing corrosion of the conductor 20. The coating 10 has a multilayer structure in which a first layer 12 containing palladium as a main component and a second layer 14 containing gold as a main component are successively laid from the conductor 20 side.

The first layer 12 is preferably a palladium plated film formed by palladium plating. Such palladium plated film can be formed by a displacement palladium plating process or a reduction palladium plating process.

The first layer 12 in the coating 10 of the present embodiment has a double-layered structure in which two layers of different compositions are laid. Namely, the first layer 12 has an inside layer 16 arranged on the conductor 20 side, and an outside layer 18 being a layer with a different composition from that of the inside layer 16 and arranged on the second layer 14 side.

A first region 31 in the inside layer 16 is a region containing palladium as a main component, and a phosphorus concentration thereof is lower than that of second region 32. The first region 31 with the lower phosphorus concentration as described above has an excellent deposition property on the conductor 20 and thus can form a coating on a stable basis and with excellent coatability on a surface of the conductor 20. On the other hand, the second region 32 in the outside layer 18 is a region containing palladium as a main component and a phosphorus concentration thereof is higher than that of the first region 31. When the phosphorus concentration is made higher in this manner, the coating can be formed with excellent corrosion resistance. It is noted that the entire inside layer 16 may be the first region 31 and the entire outside layer 18 may be the second region 32.

The phosphorus concentration of the first region 31 (inside layer 16) is preferably not more than 0.01% by mass. If this phosphorus concentration is more than 0.01% by mass, the excellent coatability will degrade and it will likely become difficult to form a film covering the conductor 20.

The phosphorus concentration of the second region 32 (outside layer 18) is preferably more than 0.01% by mass, more preferably not less than 1% by mass, and still more preferably not less than 3% by mass. If this phosphorus concentration is not more than 0.01% by mass, the corrosion resistance of the first layer 12 will degrade and the adequately excellent corrosion resistance of the coating 10 can become deteriorated. When the phosphorus concentration is not less than 1% by mass, the first layer 12 can have sufficiently high corrosion resistance. When the phosphorus concentration is not less than 3% by mass, the excellent corrosion resistance can be maintained sufficiently even if the thickness of the first layer 12 is decreased. As a result, the thickness of the coating 10 can be decreased.

The phosphorus concentration of the second region 32 (outside layer 18) is preferably not more than 7% by mass and more preferably not more than 5% by mass. If the phosphorus concentration is more than 7% by mass, the good coatability will degrade and it will likely become difficult to coat the inside layer 16. When the phosphorus concentration is not more than 5% by mass, the outside layer 18 can be formed with good coatability.

The lower limit of the thickness of the first layer 12 is preferably 0.1 μm, if the thickness is less than 0.1 μm, coating over the conductor 20 by the first layer 12 will become inadequate and the adequately excellent corrosion resistance will likely degrade. The upper limit of the thickness of the first layer 12 is preferably 0.4 μm in terms of manufacturing cost. The corrosion resistance tends not to improve so much even if the thickness of the first layer 12 is increased over 0.4 μm.

The thickness of the second layer 14 is preferably not more than 0.1 μm and more preferably in the range of 0.01 to 0.08 μm. If the thickness is more than 0.1 μm, the manufacturing cost of the coating 10 will tend to increase. If the thickness is less than 0.01 μm on the other hand, the adequately excellent corrosion resistance can degrade.

The conductor 20 can be a material containing at least one selected, for example, from copper, silver, and an alloy of these. The conductor 20 preferably contains copper in terms of reduction in manufacturing cost of the signal transmission part 100. An example of the conductor 20 is a terminal functioning as a signal transmission part and having an electrical conduction property. For example, it may be a copper terminal, an antenna signal transmission part, etc. provided on a circuit board to be mounted on an electronic component. Examples of such electronic components include active components such as transistors and integrated circuits, passive components such as capacitors, inductors and filters, and so on.

The signal transmission part 100 may be a connection terminal disposed on an electronic component and adapted to supply a power potential or a ground potential to the electronic component, or a signal terminal for input or output of signal. This signal transmission part 100 constitutes, in an electronic component, a connection terminal to be connected to another member by contact, bonding wire, or soldering, a transmission path of electric signal for letting the electronic component act as an open terminal, or a power transmission path. In this manner, the signal transmission part 100 is applicable to various applications requiring corrosion resistance.

A manufacturing method of the coating 10 in the present embodiment will be described below. The manufacturing method of coating 10 has a first palladium plating step of performing a palladium plating process on a surface of the conductor 20 to form the inside layer 16; a second palladium plating step of performing a palladium plating process on a surface of the inside layer 16 to form the outside layer 18 on the inside layer 16; and a gold plating step of performing a gold plating process on a surface of the outside layer 18 to form a gold plated film on the outside layer 18. The details of each step will be described below.

The first palladium plating step is to form a first palladium plated film on the surface of the conductor 20 after subjected to an etching process. A method for forming the first palladium plated film can be an electroless palladium plating process such as the displacement palladium plating process or the reduction palladium plating process. Either one of the two plating processes can be optionally selected in order to form a desired coating.

A plating solution (displacement reaction solution) to be used in the displacement palladium plating process can be an aqueous solution containing palladium sulfate, or the like. A displacement palladium plated film is formed in such a manner that palladium ions contained in the plating solution receive emitted electrons produced by ionization of metal of the conductor 20. For this reason, the plating solution does not have to contain a reducing agent. However, the oxidation-reduction potential of palladium in the plating solution needs to be higher than that of the metal to be ionized from the conductor 20. The displacement palladium plated film formed in such a displacement palladium plating process is generated by displacement reaction in a portion where the conductor 20 is exposed. For this reason, the displacement palladium plated film can be uniformly deposited even if the thickness is small. In the case where the inside layer 16 is formed in a small thickness, therefore, it is preferable to form the displacement palladium plated film by the displacement palladium plating process.

A plating solution (reduction reaction solution) to be used in the reduction palladium plating process can be an aqueous solution containing diamminepalladium nitrite, or the like. The phosphorus concentration of the inside layer 16 in the first layer 12 can be adjusted by varying a phosphorus concentration of the plating solution used in formation of the first palladium plated film. The reduction palladium plated film is formed in such a manner that palladium ions in the plating solution receive electrons emitted with oxidation reaction of a substance having the reduction action in the plating solution, i.e., a reducing agent. For this reason, the plating solution contains a reducing agent. Since the plating solution used in the reduction palladium plating process contains the reducing agent as described above, the palladium plated film can be formed in a desired thickness, independent of which kind of metal is contained in the conductor 20.

The reducing agent contained in the plating solution can be selected, for example, from phosphorus compounds such as hypophosphorous acid, phosphorous acid, and salts of these (e.g., sodium salt, potassium salt, and ammonium salt); carbon compounds such as formalin, formic acid, and salts thereof; boron compounds such as borofluorides and dimethylamine borane; and sulfur compounds such as thiosulfuric acid, peroxysulfuric acid and salts of these. The reducing agent may also be a multivalent metal ion, e.g., bivalent tin ion, bivalent cobalt ion, or bivalent iron ion.

The reduction palladium plated film obtained by the reduction reaction is deposited on the conductor 20 by electrons emitted from the reducing agent. For this reason, an element in the reducing agent is codeposited in the reduction palladium plated film. Therefore, the phosphorus concentration in the reduction palladium plated film can be adjusted by varying a content of the phosphorus-containing reducing agent in the plating solution.

In this manner, the inside layer 16 consisting of the displacement palladium plated film or the reduction palladium plated film can be formed on the conductor 20. Next, the second palladium plating step is carried out in such a manner that the outside layer 18 is formed on the inside layer 16 to obtain the first layer 12.

The second palladium plating step is to perform a palladium plating process on a surface of the inside layer 16 consisting of the palladium plated film, to form the outside layer 18 consisting of a palladium plated film on the inside layer 16. In the second palladium plating step, the surface of the inside layer 16 is subjected to the reduction palladium plating process which was described in the first palladium plating step. The outside layer 18 can be formed by this process. A plating solution to be used herein needs to be one with a higher phosphorus concentration than the plating solution for the reduction palladium plating employed in the first palladium plating step. The phosphorus concentration in the plating solution can be adjusted by varying a content of the phosphorus-containing reducing agent in the plating solution.

When phosphorus in the compound of the reducing agent is codeposited in the palladium plated film obtained by reduction reaction, as in this case, the corrosion resistance of the palladium plated film can improve. When the palladium plated film contains phosphorus without exceeding a codepositable limit concentration, the corrosion resistance tends to improve with increase in phosphorus concentration.

On the other hand, the coatability of the palladium plated film over an object to be plated, tends to become lower than in the case without codeposition of phosphorus. This tendency becomes stronger with increase in phosphorus concentration within the range where the phosphorus concentration in the palladium plated film does not exceed the codepositable limit concentration. Therefore, the first layer 12 and coating 10 with desired coatability and corrosion resistance can be formed by performing two or more palladium plating steps to form a plurality of palladium plated films with different phosphorus concentrations.

The gold plating step is to perform an electroless gold plating process such as a displacement gold plating process or a reduction gold plating process, to form the second layer 14 consisting of a gold plated film on a surface of the first layer 12. The gold plated film can be formed by a well-known method using a commercially available electroless gold plating solution.

The coating 10 can be produced on the conductor 20 by the above-described manufacturing method. Since the phosphorus-containing palladium plated film is normally unlikely to be deposited on the conductor 20, it is difficult to form the palladium plated film uniformly covering the surface of the conductor 20. In this manufacturing method, however, the palladium plated film with the lower phosphorus concentration is first formed on the surface of the conductor 20 and then the palladium plated film with the higher phosphorus concentration, which is hard to directly deposit on the surface of the conductor 20, is deposited thereon. Then the gold plated film is formed on such palladium plated film, thereby forming the coating 10 with high corrosion resistance, without increase in manufacturing cost. The signal transmission part 100 with the conductor 20 coated with the coating 10 as described above has adequately excellent corrosion resistance.

Next, the coating as another embodiment of the present invention will be described.

Figure 2:
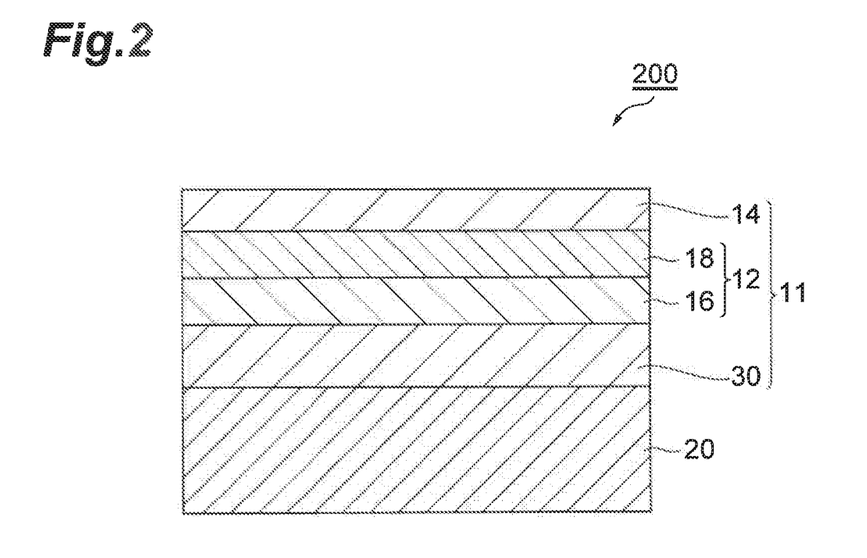
FIG. 2 is a schematic cross-sectional view showing another embodiment of the signal transmission part with the coating according to the present invention.

FIG. 2 is a cross-sectional view schematically showing the signal transmission part with the coating of the present embodiment. The signal transmission part 200 in FIG. 2 constitutes a signal transmission part of an electronic component and has a conductor 20 and a coating 11 coating the conductor 20. The coating 11 of the present embodiment is a coating layer provided for preventing corrosion of the conductor 20. The coating 11 has a multilayer structure in which an underlying layer 30 containing nickel as a main component, a first layer 12 containing palladium as a main component, and a second layer 14 containing gold as a main component are successively laid from the conductor 20 side.

Namely, the coating 11 of the present embodiment is different from the coating 10 of the above embodiment in that it has the underlying layer 30 between the conductor 20 and the first layer 12. The constituent elements other than the underlying layer 30 of the coating 11 can be the same as those of the coating 10.

The underlying layer 30 is preferably a nickel plated film formed by an electroless nickel plating process. When such underlying layer 30 is provided, the thickness of the first layer 12 can be decreased while maintaining the adequately excellent corrosion resistance. This can reduce an amount of palladium and thus reduce the manufacturing cost of the coating 11. In terms of sufficient reduction in manufacturing cost, the thickness of the underlying layer 30 is preferably not less than 2 μm. On the other hand, in the case where the signal transmission part 200 has a function of signal transmission by high-frequency radio waves, the signal tends to be transmitted through the outermost layer of the conductor 20. In that case, if the underlying layer 30 containing nickel as a main component with low electrical conductivity is adjacent to the conductor 20, a loss tends to increase. From this viewpoint, the thickness of the underlying layer 30 is preferably not more than 10 μm. The thickness of the underlying layer 30 is preferably suitably adjusted according to the thickness of the conductor 20 and the frequency of the signal.

A manufacturing method of the coating 11 according to the present embodiment will be described. The manufacturing method of coating 11 has a nickel plating step of performing an electroless nickel plating process on a surface of the conductor 20 to form a nickel plated film serving as the underlying layer 30; a first palladium plating step of performing a palladium plating process on a surface of the underlying layer 30 to form the inside layer 16; a second palladium plating step of performing a palladium plating process on a surface of the inside layer 16 to form the outside layer 18 on the inside layer 16; and a gold plating step of performing a gold plating process on a surface of the outside layer 18 to form a gold plated film on the outside layer 18. The steps except for the nickel plating step in this manufacturing method can be carried out in the same manner as in the aforementioned manufacturing method of coating 10. Therefore, the nickel plating step will be described below.

In the nickel plating step, a pretreatment is first carried out for the surface of the conductor 20. Specifically, the surface is etched with a commercially available etching solution and thereafter an activation treatment is carried out with a commercially available activation treatment solution. After that, the conductor 20 subjected to the pretreatment is immersed in an electroless nickel plating solution to form an electroless nickel plated film on the surface of the conductor 20. Thereafter, the palladium plating processes and the gold plating process are carried out in the same manner as in the manufacturing method of coating 10, to form the first layer 12 and the second layer 14, thereby manufacturing the coating 11.

The above described the preferred embodiments of the present invention, but it should be noted that the present invention is by no means limited to the above embodiments. For example, the above embodiments showed the examples wherein the first layer 12 had the multilayer structure in which the two types of palladium plated films with different phosphorus concentrations were laid, but the first layer 12 may be a layer in which the phosphorus concentration continuously decreases with decreasing distance to the conductor 20. This can form the first layer 12 with excellent corrosion resistance, while ensuring the good deposition characteristic of palladium plating on the surface of the conductor 20. The first layer 12 with the phosphorus concentration increasing toward the second layer 14 in this manner can be formed, for example, by gradually adding a phosphorus-containing component in the plating solution during the plating process, so as to gradually increase the phosphorus concentration in the plating solution.

Furthermore, at least one of the first region 31 (inside layer 16) and the second region 32 (outside layer 18) in the first layer 12 may be a region (layer) in which the phosphorus concentration continuously decreases with decreasing distance to the conductor 20.

EXAMPLES

The contents of the present invention will be described in further detail with Examples and Comparative Examples. It is, however, noted that the present invention is by no means intended to be limited to the examples below.
[Production of Signal Transmission Parts]

Example 1

<Etching Step>
Commercially available copper foil (10 μm thick) was glued to a commercially available glass epoxy substrate (length×width×thickness=30 mm×30 mm×0.5 mm) with an adhesive to obtain a substrate with copper foil (conductor). An etching solution (temperature: 30° C.) with the composition shown in Table 1 was prepared separately from the substrate. The conductor was immersed in this etching solution for one minute to etch the surface of the conductor. After the etching, the conductor was washed with water.

TABLE 1

| Component | Content |
|---|---|
| sodium persulfate | 100 g/l |
| sulfuric acid (98 mass %) | 30 ml/l |
| water | rest |

<Displacement Palladium Plating Step>
Next, a displacement reaction solution (30° C.) having the composition shown in Table 2 was prepared. The conductor having been subjected to the etching as described above was immersed in an aqueous solution (30° C.) obtained by diluting 30 ml of sulfuric acid (98 mass %) with 1 l of water, for thirty seconds. Thereafter, the conductor was immersed in the displacement reaction solution of Table 2 for one minute to form a palladium plated film (inside layer 16) on the surface of the conductor by displacement reaction. Thereafter, the conductor with the inside layer 16 thereon was washed with water.

TABLE 2

| Component | Content |
|---|---|
| palladium sulfate | 1 g/l (based on Pd) |
| sulfuric acid (98 mass %) | 30 ml/l |
| water | rest |

<Reduction Palladium Plating Step>
A reduction reaction solution (temperature: 55° C., pH: 6.0) having the composition shown in Table 3 was prepared. The conductor with the inside layer 16 thereon was immersed in the reduction reaction solution of Table 3 for five minutes to form another palladium plated film (outside layer 18) on the inside layer 16 by reduction reaction. Thereafter, the conductor with the outside layer 18 thereon was washed with water.

TABLE 3

| Component | Content |
| --- | --- |
| diamminepalladium nitrite | 1.5 g/l (based on Pd) |
| disodium ethylenediaminetetraacetate | 10 g/l |
| sodium hypophosphite | 3 g/l |
| sodium formate | 10 g/l |
| water | rest |

<Displacement Gold Plating Step>

A displacement reaction solution (temperature: 80° C., pH: 5.0) having the composition shown in Table 4 was prepared. The conductor with the first layer 12 consisting of the inside layer 16 and the outside layer 18 was immersed in the displacement reaction solution of Table 4 for twenty minutes to form a gold plated film (second layer 14) on the first layer 12 by displacement reaction. Obtained in this manner was the conductor with the coating in which the first layer 12 consisting of the inside layer 16 and the outside layer 18 containing palladium, and the second layer 14 containing gold were laid. This was defined as a signal transmission part of Example 1.

TABLE 4

| Component | Content |
| --- | --- |
| gold potassium cyanide | 2 g/l (based on Au) |
| sodium cyanide | 30 g/l |
| sodium carbonate | 20 g/l |
| water | rest |

Example 2

The conductor with the coating thereon was obtained in the same manner as in Example 1, except that the duration of immersion of the conductor in the reduction reaction solution of Table 3 was changed from five minutes to ten minutes in the reduction palladium plating step. This was defined as a signal transmission part of Example 2.

Example 3

The conductor with the coating thereon was obtained in the same manner as in Example 1, except that the duration of immersion of the conductor in the reduction reaction solution of Table 3 was changed from five minutes to twenty minutes in the reduction palladium plating step. This was defined as a signal transmission part of Example 3.

Example 4

The conductor with the coating thereon was obtained in the same manner as in Example 1, except that a reduction reaction solution (temperature: 60° C., pH: 7.5) having the composition shown in Table 5 was used instead of the reduction reaction solution of Table 3 in the reduction palladium plating step. This was defined as a signal transmission part of Example 4.

TABLE 5

| Component | Content |
| --- | --- |
| diamminepalladium nitrite | 1.5 g/l (based on Pd) |
| disodium ethylenediaminetetraacetate | 10 g/l |
| sodium hypophosphite | 10 g/l |
| water | rest |

Example 5

The conductor with the coating thereon was obtained in the same manner as in Example 4, except that the duration of immersion of the conductor in the reduction reaction solution of Table 5 was changed from five minutes to ten minutes in the reduction palladium plating step. This was defined as a signal transmission part of Example 5.

Example 6

The conductor with the coating thereon was obtained in the same manner as in Example 1, except that a reduction reaction solution (temperature: 60° C., pH: 7.0) having the composition shown in Table 6 was used instead of the reduction reaction solution of Table 3 and the duration of immersion of the conductor in the reduction reaction solution was changed from five minutes to ten minutes, in the reduction palladium plating step. This was defined as a signal transmission part of Example 6.

TABLE 6

| Component | Content |
| --- | --- |
| diamminepalladium nitrite | 1 g/l (based on Pd) |
| disodium ethylenediaminetetraacetate | 10 g/l |
| sodium hypophosphite | 15 g/l |
| water | rest |

Example 7

The conductor with the coating thereon was obtained in the same manner as in Example 1, except that a reduction reaction solution (temperature: 60° C., pH: 7.0) having the composition shown in Table 7 was used instead of the reduction reaction solution of Table 3 and the duration of immersion of the conductor in the reduction reaction solution was changed from five minutes to fifteen minutes, in the reduction palladium plating step. This was defined as a signal transmission part of Example 7.

TABLE 7

| Component | Content |
| --- | --- |
| diamminepalladium nitrite | 0.8 g/l (based on Pd) |
| diethyl cyanophosphonate | 20 g/l |
| sodium hydrogen phosphite | 15 g/l |
| water | rest |

Example 8

The conductor with the coating thereon was obtained in the same manner as in Example 1, except that a reduction reaction solution (temperature: 80° C., pH: 8.0) having the composition shown in Table 8 was used instead of the reduction reaction solution of Table 3 and the duration of immersion of the conductor in the reduction reaction solution was changed from five minutes to twenty minutes, in the reduction palladium plating step. This was defined as a signal transmission part of Example 8.

TABLE 8

| Component | Content |
| --- | --- |
| diamminepalladium nitrite | 0.5 g/l (based on Pd) |
| ammonium phosphate | 20 g/l |
| ammonium nitrate | 5 g/l |
| sodium hydrogen phosphite | 15 g/l |
| water | rest |

Example 9

<Etching Step and Reduction Palladium Plating Step>

The conductor having been subjected to etching was obtained in the same manner as in Example 1. A reduction reaction solution (temperature: 55° C., pH: 6.0) having the composition shown in Table 9 was prepared. The conductor was immersed in the reduction reaction solution of Table 9 for one minute to form a palladium plated film (inside layer 16) on the conductor by reduction reaction. After that, the conductor with the inside layer 16 thereon was washed with water.

TABLE 9

| Component | Content |
| --- | --- |
| diamminepalladium nitrite | 1.5 g/l (based on Pd) |
| disodium ethylenediaminetetraacetate | 10 g/l |
| sodium hypophosphite | 1 g/l |
| sodium formate | 10 g/l |
| water | rest |

The conductor with the inside layer 16 thereon was immersed in the reduction reaction solution of Table 6 for ten minutes to form another palladium plated film (outside layer 18) on the inside layer 16 by reduction reaction. Thereafter, the conductor with the outside layer 18 thereon was washed with water.

<Displacement Gold Plating Step>

The displacement gold plating step was carried out in the same manner as in Example 1 to obtain the conductor with the coating in which the first layer 12 consisting of the inside layer 16 and the outside 1.0 layer 18 containing palladium, and the second layer 14 containing gold were laid. This was defined as a signal transmission part of Example 9.

Example 10

<Etching Step and Reduction Palladium Plating Step>

The conductor having been subjected to etching was obtained in the same manner as in Example 1. The conductor was immersed in the reduction reaction solution of Table 9 for one minute to form a palladium plated film (inside layer 16) on the conductor by reduction reaction. In a state in which the conductor was immersed in the reduction reaction solution of Table 9, a sodium hydrogen phosphite aqueous solution (concentration: 30 mass %) was dropped into the reduction reaction solution for seven minutes. This continuously increased the sodium hydrogen phosphite concentration in the reduction reaction solution from 0 to 14 g/l. After completion of dropping of the sodium hydrogen phosphite aqueous solution, the conductor was kept immersed in the reduction reaction solution for two more minutes. By this process, another palladium plated film (outside layer 18) was formed on the inside layer 16. Thereafter, the conductor with the outside layer 18 thereon was washed with water.

<Displacement Gold Plating Step>

The displacement gold plating step was carried out in the same manner as in Example 1 to obtain the conductor with the coating in which the first layer 12 consisting of the inside layer 16 and the outside layer 18 containing palladium, and the second layer 14 containing gold were laid. This was defined as a signal transmission part of Example 10.

Example 11

<Etching Step and Activation Step>

The conductor having been subjected to etching was obtained in the same manner as in Example 1. This conductor was immersed in a commercially available activating agent (trade name: AT-450 available from C. Uyemura &. Co., Ltd., temperature: 30° C.) for one minute to perform an activation treatment. Thereafter, the conductor was washed with water.

<Nickel Plating Step>

A reduction reaction solution (temperature: 45° C., pH: 4.5) having the composition shown in Table 10 was prepared. The conductor having been subjected to the activation treatment was immersed in the reduction reaction solution of Table 10 for thirty minutes to form a nickel plated film (underlying layer 30) on the conductor by reduction reaction. After that, the conductor with the underlying layer 30 thereon was washed with water.

TABLE 10

| Component | Content |
| --- | --- |
| nickel sulfate | 20 g/l |
| sodium hypophosphite | 15 g/l |
| sodium citrate | 30 g/l |
| ammonium chloride | 30 g/l |
| water | rest |

<Reduction Palladium Plating Step>

A reduction reaction solution (temperature: 60° C., pH: 5.5) having the composition shown in Table 11 was prepared. The conductor with the underlying layer 30 thereon was immersed in the reduction reaction solution of Table 11 for one minute to form a palladium plated film (inside layer 16) on the underlying layer 30 by reduction reaction. Thereafter, the conductor with the inside layer 16 thereon was washed with water.

TABLE 11

| Component | Content |
| --- | --- |
| diamminepalladium nitrite | 1.5 g/l (based on Pd) |
| disodium ethylenediaminetetraacetate | 10 g/l |
| sodium formate | 10 g/l |
| water | rest |

The conductor with the inside layer 16 thereon was immersed in the reduction reaction solution of Table 5 for five minutes to form another palladium plated film (outside layer 18) on the inside layer 16 by reduction reaction. Thereafter, the conductor with the outside layer 18 thereon was washed with water.

<Displacement Gold Plating Step>

The displacement gold plating step was carried out in the same manner as in Example 1, to obtain the conductor with the coating in which the underlying layer 30 containing nickel, the first layer 12 consisting of the inside layer 16 and the outside layer 18 containing palladium, and the second layer 14 containing gold were laid from the copper foil side. This was defined as a signal transmission part of Example 11.

Example 12

The conductor with the coating in which the underlying layer 30 containing nickel, the first layer 12 consisting of the inside layer 16 and the outside layer 18 containing palladium, and the second layer 14 containing gold were laid from the copper foil side was obtained in the same manner as in Example 11, except that the conductor with the inside layer 16 thereon was immersed in the reduction reaction solution of Table 8 instead of the reduction reaction solution of Table 5 for twenty minutes in the reduction palladium plating step. This was defined as a signal transmission part of Example 12.

Comparative Example 1

The etching step and the activation step were carried out in the same manner as in Example 11. Then the nickel plating step was carried out to immerse the conductor in the reduction reaction solution shown in Table 10, for forty minutes to form a nickel plated film (underlying layer 30) on the conductor by reduction reaction. In this manner, the conductor with the coating consisting of the underlying layer 30 containing nickel was obtained. This was defined as a signal transmission part of Comparative Example 1.

Comparative Example 2

A nickel plated film (underlying layer 30) was formed on the conductor in the same manner as in Comparative Example 1. Thereafter, the conductor with the underlying layer 30 thereon was washed with water and the displacement gold plating step as in Example 1 was carried out to form a gold plated film (second layer 14) on the underlying layer 30. Obtained in this manner was the conductor with the coating in which the underlying layer 30 containing nickel and the second layer 14 containing gold were laid. This was defined as a signal transmission part of Comparative Example 2.

Comparative Example 3

The conductor with the coating in which the underlying layer 30 consisting of a nickel plated film and the layer consisting of a gold plated film were laid was obtained in the same manner as in Comparative Example 2. A reduction reaction solution (temperature: 90° C., pH: 705) having the composition shown in Table 12 was prepared. The conductor with the underlying layer 30 and the second layer thereon was immersed in the reduction reaction solution of Table 12 for ten minutes to form another layer of a gold plated film by reduction reaction. Obtained in this manner was the conductor with the coating in which the underlying layer 30 containing nickel and the second layer consisting of two layers containing gold were successively laid from the copper foil side. This was defined as a signal transmission part of Comparative Example 3.

TABLE 12

| Component | Content |
|---|---|
| gold potassium cyanide | 2 g/l (based on Au) |
| sodium hypophosphite | 10 g/l |
| sodium citrate | 50 g/l |
| ammonium chloride | 75 g/l |
| water | rest |

Comparative Example 4

The conductor with the coating in which the underlying layer 30 containing nickel and the second layer consisting or the two layers containing gold were successively laid was obtained in the same manner as in Comparative Example 3, except that the duration of immersion in the reduction reaction solution of Table 12 was changed from ten minutes to twenty minutes. This was defined as a signal transmission part of Comparative Example 4.

Comparative Example 5

The conductor having been subjected to etching was obtained in the same manner as in Example 1. The conductor was immersed in the reduction reaction solution of Table 9 for ten minutes to form a palladium plated film (inside layer 16) on the conductor by reduction reaction. Thereafter, the conductor with the inside layer 16 thereon was washed with water.

The displacement gold plating step was carried out in the same manner as in Example 1, to obtain the conductor with the coating in which the first layer consisting of the inside layer 16 containing palladium and the second layer 14 containing gold were laid. This was defined as a signal transmission part of Comparative Example 5.

Comparative Example 6

The conductor having been subjected to etching was obtained in the same manner as in Example 1. The conductor was immersed in the reduction reaction solution of Table 3 for five minutes. After the immersion, the conductor was taken out of the reduction reaction solution and the surface of the conductor was observed. It was observed that palladium was plated in a macular pattern on the surface of the conductor. In this manner, the copper foil was exposed in the surface of the conductor, resulting in a failure in forming a palladium-containing layer.

Comparative Example 7

The conductor having been subjected to etching was obtained in the same manner as in Example 1. The conductor was immersed in the reduction reaction solution of Table 5 for five minutes. After the immersion, the conductor was taken out of the reduction reaction solution and the surface of the conductor was observed. It was observed that palladium was plated in a macular pattern on the surface of the conductor. In this manner, the copper foil was exposed in the surface of the conductor, resulting in a failure in forming a palladium-containing layer.

Comparative Example 8

The conductor having been subjected to etching was obtained in the same manner as in Example 1. The conductor was immersed in the reduction reaction solution of Table 6 for ten minutes. After the immersion, the conductor was taken out of the reduction reaction solution and the surface of the conductor was observed. It was observed that palladium was plated in a macular pattern on the surface of the conductor. In this manner, the copper foil was exposed in the surface of the conductor, resulting in a failure in forming a palladium-containing layer.

Comparative Example 9

The conductor having been subjected to etching was obtained in the same manner as in Example 1. The conductor was immersed in the reduction reaction solution of Table 7 for fifteen minutes. After the immersion, the conductor was taken out of the reduction reaction solution and the surface of the conductor was observed. It was observed that palladium was plated in a macular pattern on the surface of the conductor. In this manner, the copper foil was exposed in the surface of the conductor, resulting in a failure in forming a palladium-containing layer.

[Evaluation of Signal Transmission Parts]

The signal transmission part in each of the examples and comparative examples was cut along the lamination direction of the first layer 12 and the second layer 14 and a cut surface was observed with a transmission electron microscope (TEM) to obtain the respective thicknesses of the first layer 12 and the second layer 14. In the same cut surface, analysis was conducted by energy dispersive X-ray spectrometry (EDS) to measure the phosphorus concentrations of the inside layer 16 and the outside layer 18 in the first layer. The results of these are provided together in Table 13.

In accordance with JIS C 5402-11-14, a single gas flow corrosion test was conducted in the following procedure to evaluate the corrosion resistance of the signal transmission part in each of the examples and comparative examples. First, the resultant signal transmission part was exposed to a contamination gas atmosphere (temperature: 30° C., relative humidity: 75%) containing 10 ppm of $SO_2$ gas in volume term. A duration of the exposure was four days. A surface of the coating after the exposure was observed with an optical microscope (magnification: 50×) and the number of pits detected in the field (length×width=6.0 mm×4.5 mm) was counted. The results are provided as the evaluation results of anticorrosion in Table 13.

TABLE 13

|  | 1st layer | | | 2nd layer | Underlayer | Evaluation | | |
|---|---|---|---|---|---|---|---|---|
|  | P content (mass %) | | T | T | T | Pr/Ab of | anticorrosion | coating |
|  | inside 16 | outside 18 | μm | μm | μm | 1st layer | (pit count) | cost |
| Example 1 | 0% | 0.05% | 0.1 | 0.05 | Ab | Pr | 7 | A |
| Example 2 | 0% | 0.05% | 0.2 | 0.05 | Ab | Pr | 3 | A |
| Example 3 | 0% | 0.05% | 0.4 | 0.05 | Ab | Pr | 0 | B |
| Example 4 | 0% | 1% | 0.1 | 0.05 | Ab | Pr | 1 | A |
| Example 5 | 0% | 1% | 0.2 | 0.05 | Ab | Pr | 0 | A |
| Example 6 | 0% | 3% | 0.1 | 0.05 | Ab | Pr | 0 | A |
| Example 7 | 0% | 5% | 0.1 | 0.05 | Ab | Pr | 0 | A |
| Example 8 | 0% | 7% | 0.1 | 0.05 | Ab | Pr | 3 | A |
| Example 9 | 0.01% | 3% | 0.1 | 0.05 | Ab | Pr | 0 | A |
| Example 10 | 0.01% | 2% | 0.1 | 0.05 | Ab | Pr | 0 | A |
| Example 11 | 0% | 1% | 0.1 | 0.05 | 4 | Pr | 0 | A |
| Example 12 | 0% | 7% | 0.1 | 0.05 | 4 | Pr | 0 | A |
| Comp Ex 1 | — | — | Ab | Ab | 5 | Ab | totally corroded | A |
| Comp Ex 2 | — | — | Ab | 0.05 | 5 | Ab | 188 | A |
| Comp Ex 3 | — | — | Ab | 0.30 | 5 | Ab | 41 | B |
| Comp Ex 4 | — | — | Ab | 0.50 | 5 | Ab | 2 | C |
| Comp Ex 5 | 0.01% | 0.01% | 0.1 | 0.05 | Ab | Pr | 36 | A |
| Comp Ex 6 | — | — | Ab | — | Ab | Ab | — | — |
| Comp Ex 7 | — | — | Ab | — | Ab | Ab | — | — |
| Comp Ex 8 | — | — | Ab | — | Ab | Ab | — | — |
| Comp Ex 9 | — | — | Ab | — | Ab | Ab | — | — |

Pr: present
Ab: absent
T: thickness

The phosphorus concentration of the outside layer 18 in the first layer in the signal transmission part of Example 10 continuously increased from the conductor 20 side toward the second layer 14 side. The phosphorus concentration of the outside layer 18 in Example 10 shown in Table 13 is the phosphorus concentration of the outside layer 18 on the second layer 14 side.

In Table 13, the coating cost was evaluated based on the following criteria: "A" for the coating in which the thickness of the first layer (palladium plated film) is not more than 0.2 μm and the thickness of the second layer (gold plated film) is not more than 0.1 μm; "B" for the coating in which the thickness of the first layer is over 0.2 μm and not more than 0.6 μm and the thickness of the second layer is over 0.1 μm and not more than 0.4 μm; "C" for the coating in which the thickness of the second layer is over 0.4 μm.

The coatings in Examples 1 to 12 had the relatively small thickness because the thickness of the first layer was 0.1-0.4 μm and the thickness of the second layer 0.05 μm. It was confirmed that the coatings in Examples 1 to 12 had adequately excellent corrosion resistance while they had the relatively small thickness as described above.

The present invention provides the coating that can be formed at low cost and with adequately excellent corrosion resistance. It is also feasible to provide an electronic component having the signal transmission part at low manufacturing cost and with adequately excellent corrosion resistance, by provision of the coating.

What is claimed is:
1. A manufacturing method of a coating provided on a conductor, the coating including a first layer and a second layer deposited on the first layer such that the first layer is between the conductor and the second layer, the first layer having an inside layer and an outside layer from the conductor side, the manufacturing method comprising:

a first palladium plating step of forming the inside layer on the conductor;

a second palladium plating step of forming the outside layer on the inside layer; and a gold plating step of forming the second layer on the outside layer, the first layer containing palladium, the first layer being deposited on and in direct contact with the conductor without an intervening layer, the conductor being made of copper, silver, or alloy thereof; and the second layer containing gold, wherein the outside layer has a phosphorus concentration and the inside layer has a phosphorus concentration, and the phosphorus concentration in the inside layer is not more than 0.01% by mass and the phosphorus concentration in the outside layer is not less than 1% by mass, and not more than 5% by mass, the phosphorus concentration of the outside layer decreasing with decreasing distance to the conductor, by gradually adding a phosphorus-containing component in a plating solution during the second palladium plating step.

2. The manufacturing method according to claim 1, wherein the first layer has a thickness between 0.1 and 0.4 µm.

3. A manufacturing method for providing a coating comprising first and second layers on a conductor made of copper, silver, or an alloy thereof, the method comprising:

plating palladium on the conductor to form an insider layer of the first layer containing palladium on the conductor;

plating palladium on the inside layer to form an outside layer of the first layer containing palladium and phosphorous in a manner that comprises gradually adding a phosphorous-containing component to a plating solution that contacts the inside layer so as to gradually increase the phosphorous concentration in the plating solution during plating; and plating gold on the outside layer of the first layer to form the second layer containing gold on the outside layer, wherein:

the inside layer is deposited on and in direct contact with the conductor without an intervening layer;

a phosphorus concentration in the inside layer is not more than 0.01% by mass;

a phosphorus concentration in the outside layer is not less than 1% by mass, and not more than 5% by mass; and the phosphorus concentration of the outside layer decreases with decreasing distance to the conductor.

4. The manufacturing method according to claim 3, wherein the inside layer is formed by a displacement palladium plating process that comprises contacting the conductor with a displacement plating solution that does not contain a reducing agent.

5. The manufacturing method according to claim 4, wherein the displacement plating solution contains palladium sulfate.

6. The manufacturing method according to claim 3, wherein the outside layer is formed by a reduction palladium plating process such that the plating solution contains a reducing agent.

7. The manufacturing method according to claim 6, wherein the plating solution of the reduction palladium plating process contains diamminepalladium nitrite.

8. The manufacturing method according to claim 3, wherein the phosphorous-containing component is gradually added to the plating solution that contacts the inside layer in a dropwise manner so as to gradually increase the phosphorous concentration in the plating solution during plating.

9. The manufacturing method according to claim 3, wherein the coating has a pit count of no higher than 7, including 0, as a result of a single gas flow corrosion test in accordance with JIS C 5402-11-14.

10. The manufacturing method according to claim 3, wherein phosphorus concentration of the outside layer is not less than 3% by mass, and not more than 5% by mass.

11. The manufacturing method according to claim 3, wherein the second layer has a thickness of not more than 0.1 µm.

12. The manufacturing method according to claim 3, wherein the second layer has a thickness of 0.01 and 0.08 µm.

* * * * *